(12) United States Patent
Iwasaki

(10) Patent No.: US 8,203,221 B2
(45) Date of Patent: Jun. 19, 2012

(54) SEMICONDUCTOR DEVICE AND METHOD FOR MANUFACTURING THE SAME, AND SEMICONDUCTOR SEALING RESIN

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 59 days.

(21) Appl. No.: 12/541,206

(22) Filed: Aug. 14, 2009

(65) Prior Publication Data

US 2010/0052139 A1 Mar. 4, 2010

(30) Foreign Application Priority Data

Sep. 1, 2008 (JP) .................................. 2008-222979

(51) Int. Cl.
*H01L 23/29* (2006.01)
(52) U.S. Cl. .......................... 257/788; 257/787; 257/792
(58) Field of Classification Search .................. None
See application file for complete search history.

(56) References Cited

U.S. PATENT DOCUMENTS

| | | | | |
|---|---|---|---|---|
| 4,610,932 | A | * | 9/1986 | Haynes et al. ................. 428/611 |
| 5,246,511 | A | * | 9/1993 | Nakamura et al. ............. 148/621 |
| 2007/0027273 | A1 | * | 2/2007 | Murotani ....................... 525/481 |

FOREIGN PATENT DOCUMENTS

| | | |
|---|---|---|
| JP | 09-195068 | 7/1997 |
| JP | 10-335559 | 12/1998 |
| JP | 11-229178 | 8/1999 |
| JP | 2001-335708 | 12/2001 |
| JP | 2003-068965 | 3/2003 |

OTHER PUBLICATIONS

Kittel, "Introduction to Solid State Physics", first volume, fifth edition: p. 28, Maruzen Co., Ltd., (1978).
Takahara, "Surface and Interface Analyses for Development of High-performance Polymers", Denso Technical Review: vol. 12, No. 2, pp. 3-12 (Sep. 2007).
Japanese Official Action issued Jun. 1, 2010, for Application No. 2008-222979.

* cited by examiner

*Primary Examiner* — Fei Fei Yeung Lopez
(74) *Attorney, Agent, or Firm* — Antonelli, Terry, Stout & Kraus, LLP.

(57) ABSTRACT

There is provided a semiconductor device which has been improved in adhesion between leads and a sealing resin (molding resin), and thus does not undergo peeling therebetween, and has high reliability.
The semiconductor device includes a semiconductor chip, a plurality of leads including a metal as a main constitutional material, electrically connected with the semiconductor chip, and a resin for sealing the semiconductor chip, wherein the plurality of leads each have an outer lead portion exposed from the resin and an inner lead portion embedded in the resin, and the resin contains an aromatic compound having a benzene ring and/or a compound having a cyclohexane ring, and the benzene ring and/or the cyclohexane ring contained in the resin and a metal atom which is a main constitutional material of a surface material of the inner lead portion are arranged so as to be superposed one on the other at an interface at which the surface material of the inner lead portion and the resin are in contact with each other.

7 Claims, 18 Drawing Sheets

A COPPER ATOM IS ARRANGED JUST UNDER A CENTER OF A BENZENE RING, SO THAT LATTICE MATCHING IS FAVORABLE.

A COPPER ATOM IS NOT ARRANGED JUST UNDER A CENTER OF A BENZENE RING, SO THAT LATTICE MATCHING IS NOT FAVORABLE. SILVER IS FAVORABLE IN MATCHING WITH CYCLOHEXANE

SEMICONDUCTOR DEVICE AND METHOD FOR MANUFACTURING THE SAME, AND SEMICONDUCTOR SEALING RESIN

CLAIM OF PRIORITY

The present application claims priority from Japanese Patent application serial No. 2008-222979, filed on Sep. 1, 2008, the content of which is hereby incorporated by reference into this application.

BACKGROUND OF THE INVENTION

1. Field of the Invention

The present invention relates to a semiconductor device and a method for manufacturing the same, and a semiconductor sealing resin.

2. Description of Related Art

In Document 1 (Japanese Patent Laid-open No. Hei 09-195068), there is disclosed a method in which Cu strike plating is performed as undercoat on a lead base metal including a Cu alloy, and then, silver, gold, palladium, or the like for wire bonding or for die bonding is selectively plated, and the resulting lead-connected semiconductor chip is sealed with a resin or the like.

Document 2 (INTRODUCTION TO SOLID STATE PHYSICS, KITTEL, first volume, fifth edition: p. 28, MARUZEN Co., Ltd., (1978)) is a classic literature regarding solid state physics, and contains lattice constant (nearest-neighbor interatomic distance), or the like.

In Document 3 (DENSO TECHNICAL REVIEW: vol. 12, No. 2, pp. 3-12 (2007)), there are described analysis technologies by means of surface X-ray diffraction using synchrotron radiation, and a scanning force microscope regarding a structure and control of physical properties of a polymer solid surface in wettability, friction and abrasion characteristics, adhesion, biocompatibility, and the like of a polymer material.

As described in Document 1, even when the method in which a semiconductor chip is sealed with the resin or the like after plating the lead base metal with copper, silver, gold, palladium, or the like is carried out, the adhesion between a plated surface thereof and a sealing body including the resin or the like is not sufficient, which may cause peeling off. Then, the problem of peeling off has been becoming more serious because lead-free solder requiring a higher reflow temperature than ever has come into use.

It is an object of the present invention to provide a semiconductor device which has been improved in adhesion between the lead and the sealing body resin (a mold resin), and does not undergo peeling therebetween. Further, it is another object of the present invention to provide a semiconductor device with high reliability.

Still further, it is a still other object of the present invention to provide a method for manufacturing a semiconductor device with high yield.

Furthermore, it is a furthermore object of the present invention to provide a semiconductor sealing resin which does not undergo peeling.

The foregoing and other objects, and novel features of the present invention will be apparent from description of this specification and the accompanying drawings.

SUMMARY OF THE INVENTION

A semiconductor device of the present invention includes: a semiconductor chip, a plurality of leads containing a metal as a main constitutional material, electrically connected with the semiconductor chip, and a resin for sealing the semiconductor chip, characterized in that the plurality of leads each have an outer lead portion exposed from the resin and an inner lead portion embedded in the resin, and the resin contains an aromatic compound having a benzene ring and/or a compound having a cyclohexane ring, and the benzene ring and/or the cyclohexane ring contained in the resin and a metal atom which is a main constitutional material of a surface material of the inner lead portion are arranged so as to be superposed one on the other at an interface at which the surface material of the inner lead portion and the resin are in contact with each other.

In accordance with the present invention, it is possible to provide a semiconductor device which has been improved in adhesion between the lead and the sealing body resin (mold resin), and does not undergo peeling therebetween. Further, in accordance with the present invention, it is possible to provide a method for manufacturing a semiconductor device with high reliability.

DETAILED DESCRIPTION OF THE INVENTION

Figure 1:
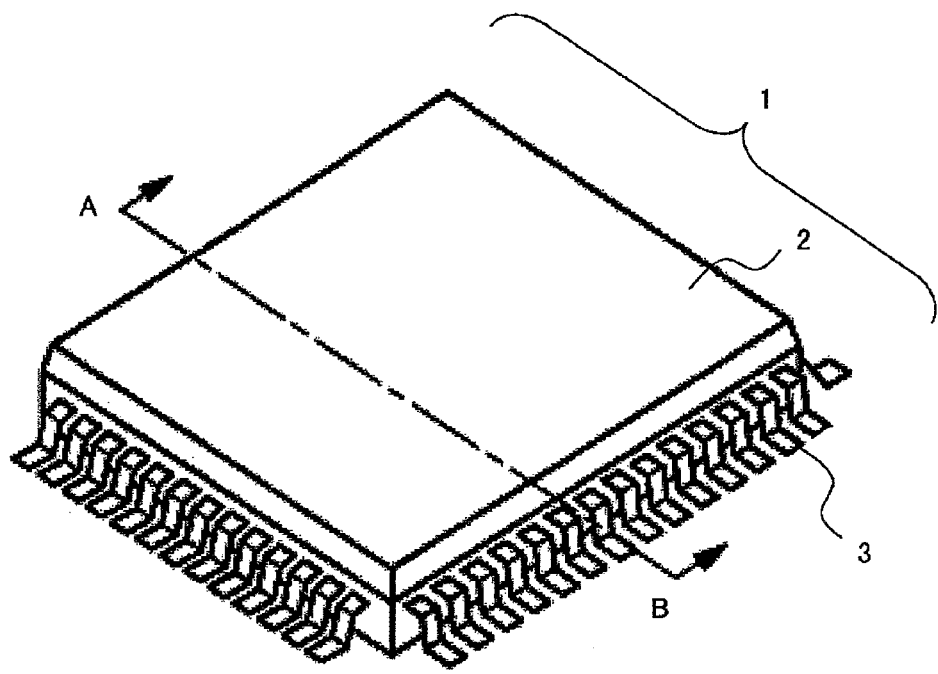
FIG. 1 is a perspective view of a semiconductor device showing an embodiment of the present invention.

The present invention relates to a semiconductor device and a manufacturing technology thereof. Particularly, it relates to a technology effectively applicable to the semiconductor device having a structure in which an aromatic compound resin is used as a sealing body for sealing a semiconductor chip, and a part of a lead is exposed from the sealing body, and manufacturing thereof. Further, it relates to a resin for use as the sealing body.

We conducted a close study in order to obtain a means for improving an adhesion between the lead and the sealing resin (mold resin) in the semiconductor device including the semiconductor chip, a plurality of leads including a metal as a main constitutional material, electrically connected with the semiconductor chip, and the resin for sealing the semiconductor chip. As a result, we found that it is effective to use a combination of materials with high lattice coherence as the combination of the surface material of the leads and the sealing resin.

Specifically, in the semiconductor device including the semiconductor chip, the plurality of leads including the metal, electrically connected with the semiconductor chip, and the resin for sealing the semiconductor chip, effectively, a (111) oriented film of copper (Cu) or nickel (Ni) is used as a surface material of an inner lead portion, and the surface material thereof is allowed to contain one selected from a group consisting of 0.5 to 12 at % boron (B), 0.2 to 13 at % manganese (Mn), and 0.2 to 13 at % silicon (Si) as an additive element, and an aromatic compound containing a benzene ring are used as the resin.

In the semiconductor device including the semiconductor chip, the plurality of leads including a metal, electrically connected with the semiconductor chip, and the resin for sealing the semiconductor chip, effectively, the (111) oriented film of copper or nickel is used as the surface material of the inner lead portion, and the surface material thereof is allowed to contain an oxygen, and an aromatic compound containing a benzene ring is used as the resin, and the resin is allowed to contain cyclohexane molecules (which may also be referred to as a cyclohexane ring).

In the semiconductor device including the semiconductor chip, the plurality of leads including a metal, electrically connected with the semiconductor chip, and the resin for sealing the semiconductor chip, effectively, a (111) oriented film of platinum (Pt) or palladium (Pd), or a (001) oriented film of ruthenium (Ru) is used as the surface material of the inner lead portion, and the surface material thereof is allowed to contain one selected from a group consisting of 0.1 to 12 at % boron, 0.2 to 13 at % manganese, and 0.4 to 13 at % silicon, and the aromatic compound containing the benzene ring is used as the resin.

In the semiconductor device including the semiconductor chip, the plurality of leads containing the metal, electrically connected with the semiconductor chip, and the resin for sealing the semiconductor chip, effectively, the (111) oriented film of platinum or palladium, or the (001) oriented film of ruthenium is used as the surface material of the inner lead portion, and the aromatic compound containing the benzene ring is used as the resin, and the resin is allowed to contain the cyclohexane molecules.

In the semiconductor device including the semiconductor chip, the plurality of leads including the metal, electrically connected with the semiconductor chip, and the resin for sealing the semiconductor chip, effectively, a (111) oriented film of gold (Au) or silver (Ag) is used as the surface material of the inner lead portion, the aromatic compound containing the benzene ring is used as the resin, and the resin is allowed to contain the cyclohexane molecules. In this case, preferably, it is further effective that gold or silver is allowed to contain one selected from a group consisting of 0.2 to 13 at % boron, 0.4 to 13 at % manganese, and 0.1 to 12 at % silicon as an additive element.

In following embodiments, the embodiments may be described in a plurality of divided sections or embodiments for convenience, if required. However, unless otherwise specified, these are not independent of each other, but are in a relation such that one is a modification example of a part or the whole of the other, or details, complementary explanation, or the like of the other.

Further, in the following embodiments, when a reference is made to the number of elements, and the like (including number, numerical value, quantity, range or the like), the number of elements is not limited to the specific number, but may be greater than or less than the specific number, unless otherwise specified, or except the case where the number is apparently limited to the specific number in principle, or except for other cases.

Further, in the following embodiments, it is naturally understood that the constitutional elements (including element steps or the like) are not always essential, unless otherwise specified, or except the case where they are apparently considered essential in principle, or except for other cases.

Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numerical values and ranges.

Whereas, in all the drawings for describing the embodiments, the same members are given the same reference signs and numerals in principle, and a repeated description thereon is omitted.

Embodiments

Hereinafter, the embodiments of the present invention will be described in details by way of examples shown in the accompanying drawings.

Figure 2:
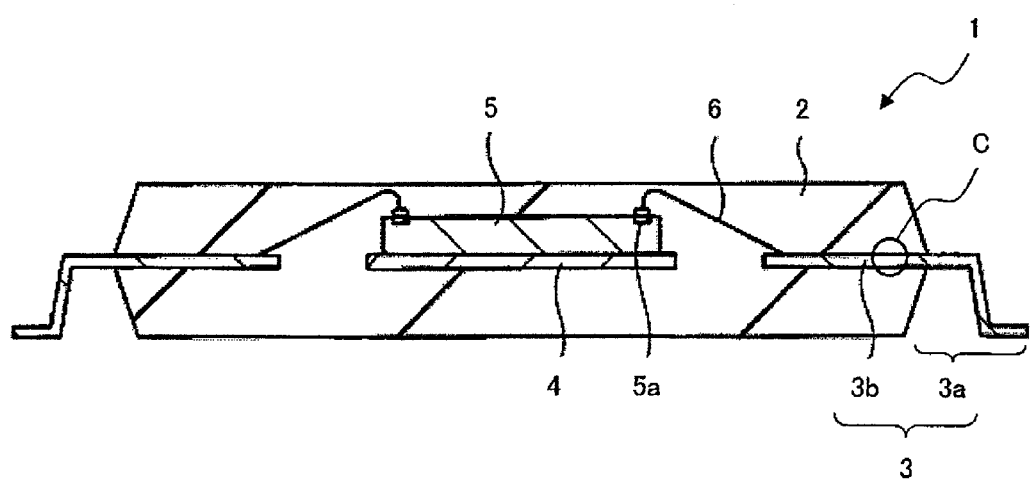
FIG. 2 is a cross sectional view along A-B of FIG. 1.

First, FIG. 1 is a perspective view of a semiconductor device which is an embodiment in the present invention. Whereas, FIG. 2 shows a cross sectional view along line A-B of FIG. 1. A package form of the semiconductor device in this embodiment is a QFP (Quad Flat Package).

As shown in FIG. 1, a semiconductor device 1 in this embodiment is covered with a resin (sealing body) 2 in a shape of a rectangular parallelepiped, and leads 3 project from the four side surfaces of the resin 2. Each lead 3 is in an L-shaped bent structure.

Further, as shown in FIG. 2, the lead 3 includes an outer lead 3a projecting from the side surface of the resin 2, and an inner lead 3b formed in an inside of the resin 2. At a central part interposed between left and right inner leads 3b (surrounded by a plurality of inner leads 3b), a tab 4 is formed. On the tab 4, a semiconductor chip 5 is disposed. In the semiconductor chip 5, circuit elements such as a MISFET (Metal Insulator Semiconductor Field Effect Transistor) and wirings are formed. On the uppermost layer, bonding pads 5a are formed. Each bonding pad 5a is connected with a wire 6, and the wire 6 is connected to the inner lead 3b.

Figure 3:
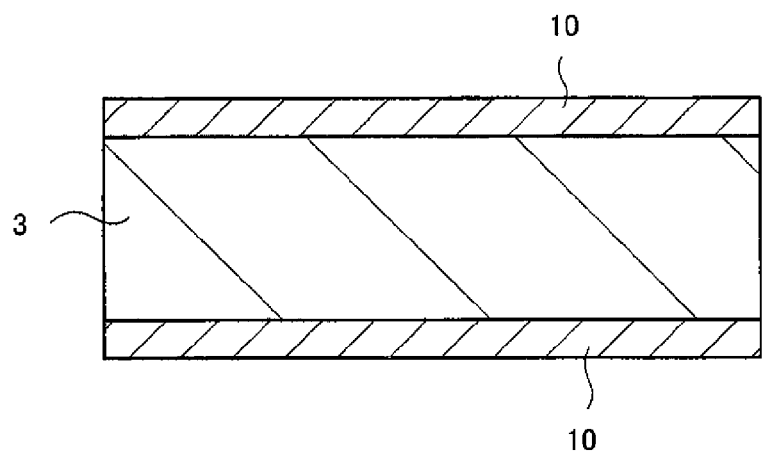
FIG. 3 is an enlarged cross sectional view showing a part of a lead formed in the semiconductor device of FIG. 2.

FIG. 3 is an enlarged view illustrating a region C of FIG. 2. Namely, FIG. 3 is a cross sectional view, on an enlarged scale, of the inner lead 3b embedded in the resin 2.

As shown in FIG. 3, in a front surface (including a back surface) of the inner lead 3b, a surface layer 10 is formed. The lead 3 includes copper, a copper alloy, a nickel alloy, or an iron alloy as a main material. The surface layer 10 includes copper, nickel, platinum, ruthenium, palladium, gold, silver, or the like as a main material. However, in the present invention, as described below, boron, manganese, silicon, or the like may be contained therein as an additive element in order to improve the adhesion with the resin 2. Further, in order to improve the adhesion, the resin 2 is allowed to contain a benzene ring or cyclohexane molecules. The surface layer 10 is formed by, for example, plating, a chemical vapor deposition process, or sputtering. However, plating is preferred for increasing a manufacturing speed or reducing a cost. Further, in order to form the surface layer 10 with high crystal orientation described later, it is preferable that plating is performed at a temperature as high as 35° C. or more as a temperature condition. This is due to the following. At the temperature as high as 35° C. or more, atoms tend to move actively, and hence become more likely to stay in a more stable arrangement. However, too high temperature causes corrosion in wet plating. For this reason, plating is desirably performed at a temperature of 70° C. or less.

Hereinafter, a description will be given to a selection of a preferred combination of the material for the surface layer 10 and the resin 2, and an adhesion improving effect thereby.

First, a liquid crystalline wholly aromatic polyester containing 80 at % benzene ring (e.g., SUMIKA SUPER manufactured by Sumitomo Chemical Co., Ltd.) is used as the resin 2, and respective (111) oriented crystals of copper, nickel, platinum, palladium, silver, and gold, and the (001) oriented crystal of ruthenium are used as the surface layer 10. In these cases, results of experimental evaluation of the adhesion between the resin 2 and the surface layer 10 are shown in FIGS. 4 to 10. FIG. 4, FIG. 5, FIG. 6, FIG. 7, FIG. 8, FIG. 9, and FIG. 10 are the results when copper, nickel, platinum, palladium, ruthenium, gold and silver are used as the surface layer 10, respectively.

In these graphs, a peel strength F/Fo of a vertical axis is expressed in a nondimensionalized form by dividing an adhesive fracture energy F with an adhesive fracture energy Fo in the case of zero on a horizontal axis. Values of Fo are 0.226, 0.258, 0.153, 0.156, 0.158, 0.095 and 0.094 for copper, nickel, platinum, palladium, ruthenium, gold and silver, respectively. Incidentally, a unit thereof is Joule per square meter.

Herein, the values of Fo of platinum, palladium and ruthenium are smaller than those of copper and nickel. Further, the values of Fo of silver and gold are smaller than these. We found that, as a control factor determining a magnitude relation thereof, a lattice mismatch with the benzene ring forming the resin 2 is important. Namely, we found that the adhesive fracture energy Fo is larger as a nearest-neighbor interatomic distance of the surface layer 10 is closer to 0.243 nanometers of a distance between second nearest-neighbor carbon atoms of the benzene ring. Herein, the nearest-neighbor interatomic distances of copper, nickel platinum, palladium, ruthenium, gold and silver are 0.256, 0.249, 0.277, 0.275, 0.265, 0.288, and 0.289, respectively, in unit of nanometer. These can be obtained with ease from, for example, a lattice constant (the nearest-neighbor interatomic distance or the like) described on page 28 of Document 2. We found that the smaller the difference between these values and 0.243 nanometers of the distance between the second nearest-neighbor carbon atoms of the benzene ring is, the larger Fo is.

Thus, we also found the following. As for the results of F/Fo under conditions that the additive elements shown in FIGS. 4 to 10 are contained, addition of the additive elements can provide an effect of making the nearest-neighbor interatomic distance of the surface layer 10 close to 0.243 nanometers, which can increase F/Fo. However, when the additive elements are added in a too high concentration, a crystal structure of the surface layer 10 becomes unstable, so that F/Fo becomes rather smaller. Therefore, as shown in FIGS. 4 to 10, the concentration of the additive element has a proper concentration range for increasing F/Fo. Effective concentration ranges are as follows.

Figure 4:
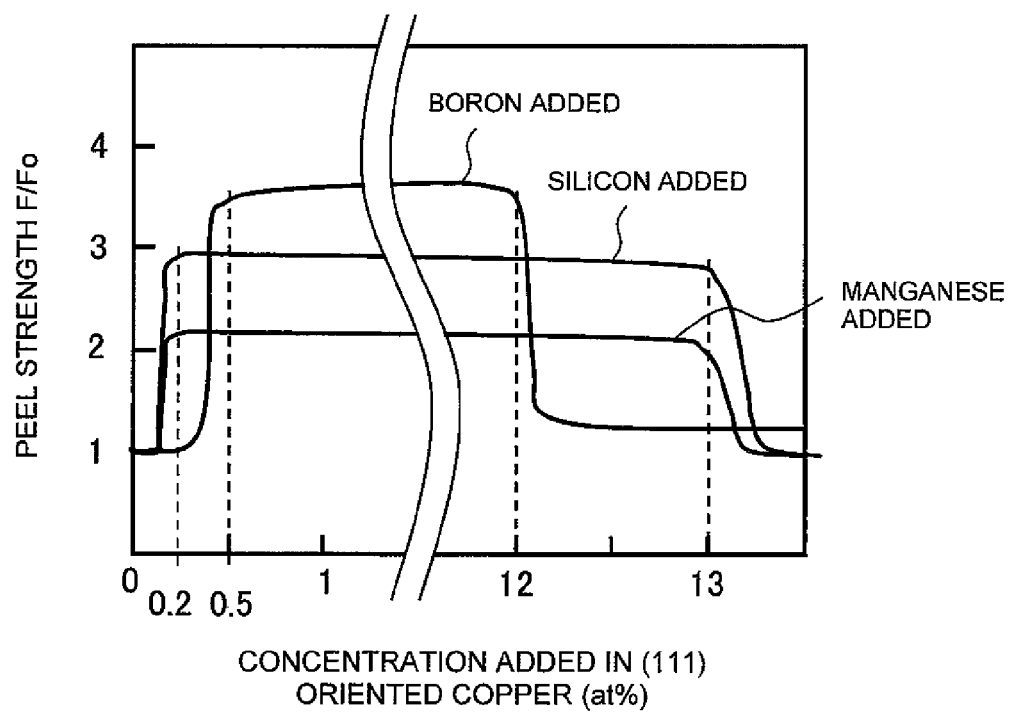
FIG. 4 is a graph showing effects of additive elements contained in (111) oriented copper exerted on peel strength.
Figure 5:
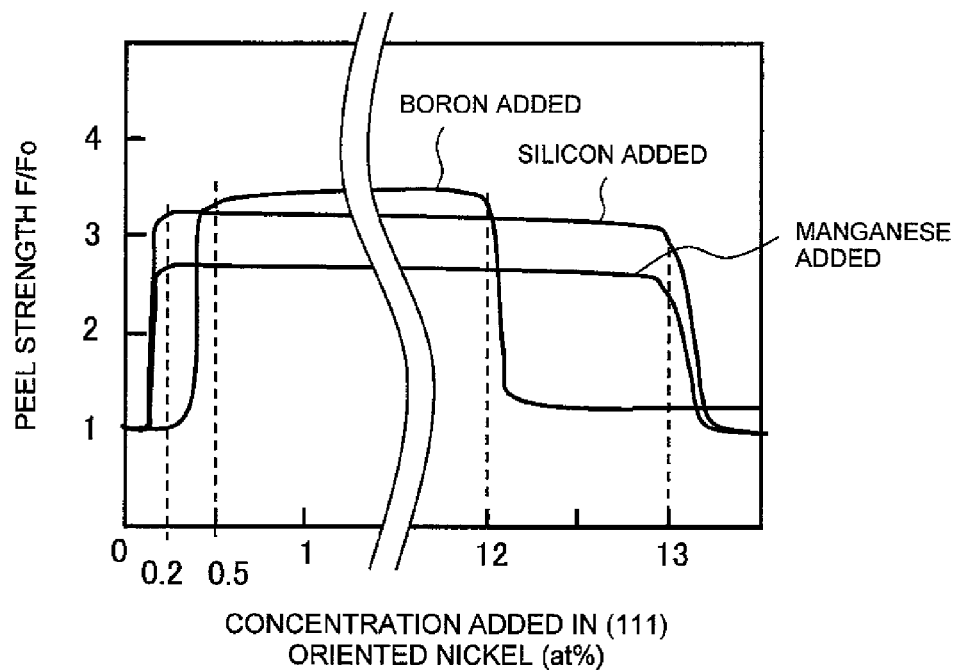
FIG. 5 is a graph showing effects of additive elements contained in (111) oriented nickel exerted on peel strength.

From FIGS. 4 and 5, when the (111) oriented film of copper or nickel is used as the surface material of the inner lead portion, it is effective that the surface material is allowed to contain one selected from a group consisting of 0.5 to 12 at % boron, 0.2 to 13 at % manganese, and 0.2 to 13 at % silicon as the additive element.

Figure 6:
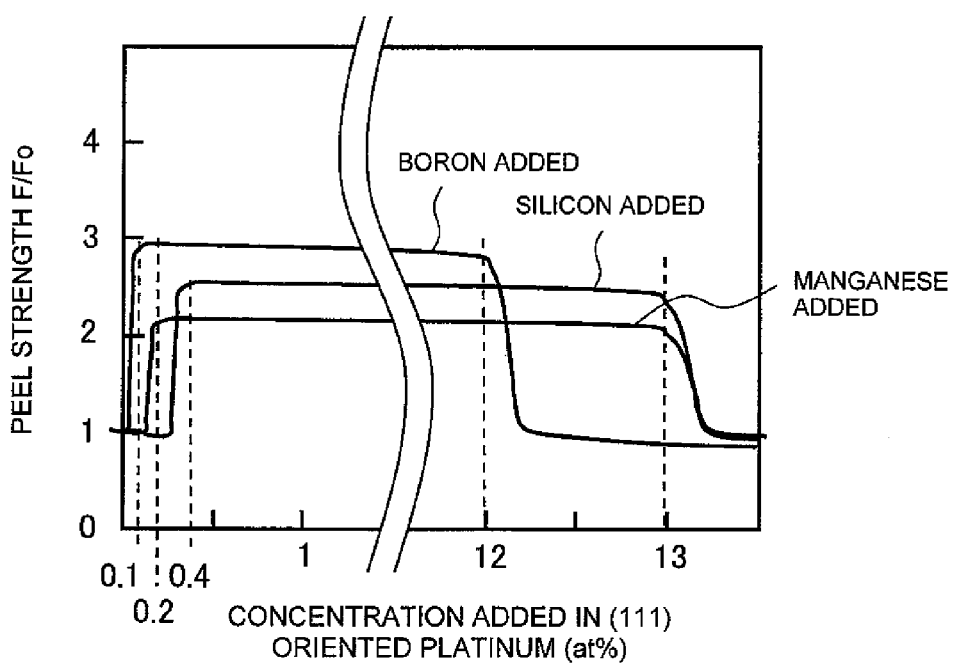
FIG. 6 is a graph showing effects of additive elements contained in (111) oriented platinum exerted on peel strength.
Figure 7:
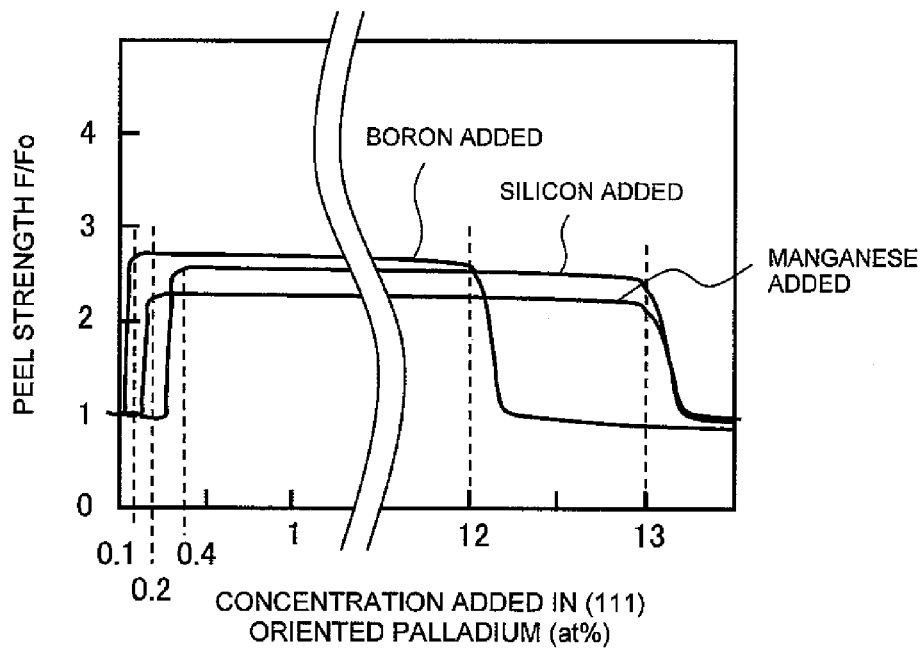
FIG. 7 is a graph showing effects of additive elements contained in (111) oriented palladium exerted on peel strength.
Figure 8:
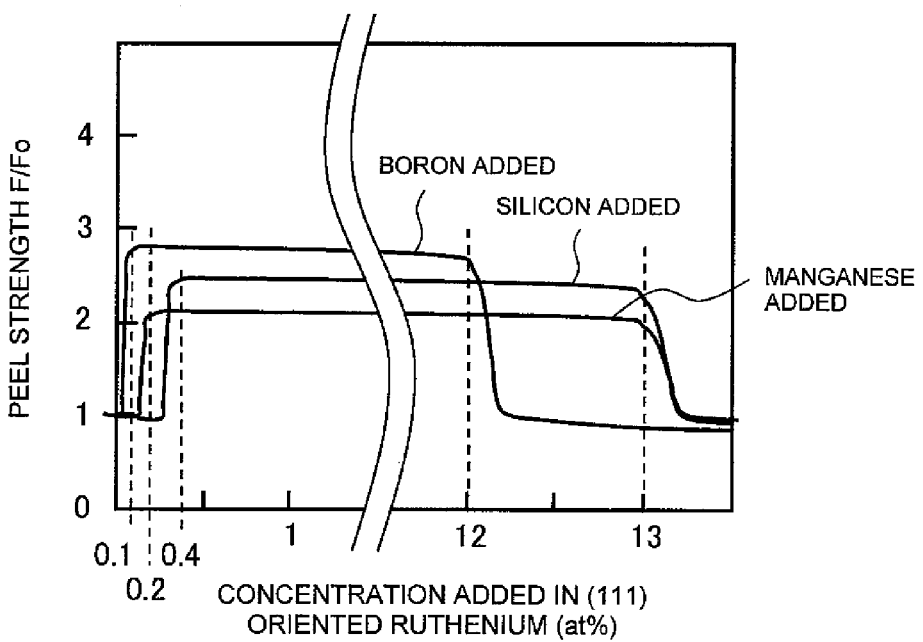
FIG. 8 is a graph showing effects of additive elements contained in (001) oriented ruthenium exerted on peel strength.

From FIGS. 6, 7 and 8, it is effective that the (111) oriented film of platinum or palladium, or the (001) oriented film of ruthenium is used as the surface material of the inner lead portion, and the surface material is allowed to contain one selected from a group consisting of 0.1 to 12 at % boron, 0.2 to 13 at % manganese, and 0.4 to 13 at % silicon as the additive element.

Figure 9:
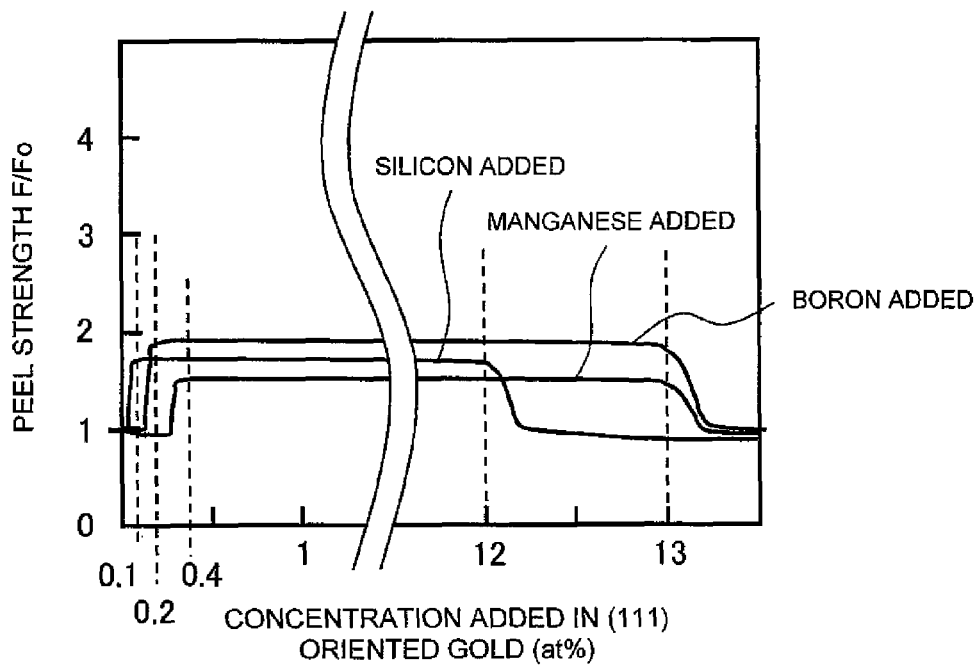
FIG. 9 is a graph showing effects of additive elements contained in (111) oriented gold exerted on peel strength.
Figure 10:
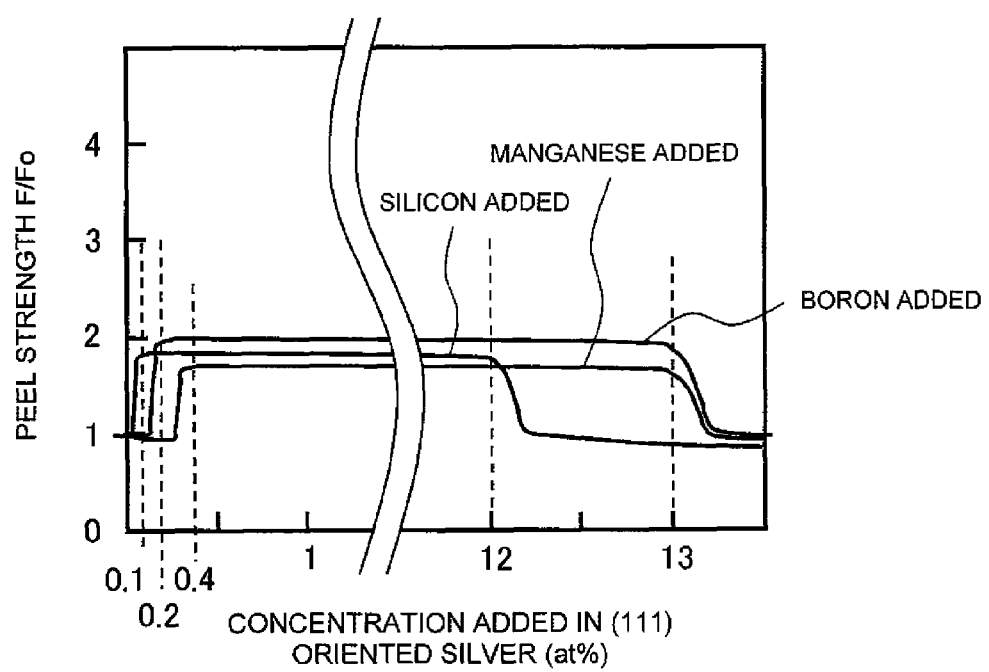
FIG. 10 is a graph showing effects of additive elements contained in (111) oriented silver exerted on peel strength.

From FIGS. 9 and 10, when the (111) oriented film of gold or silver is used as the surface material of the inner lead portion, it is effective that the surface material is allowed to contain one selected from a group consisting of 0.2 to 13 at % boron, 0.4 to 13 at % manganese, and 0.1 to 12 at % silicon as the additive element.

As for gold and silver, the adhesive fracture energy Fo under a condition that it contains no additive element is small, and the adhesion is inherently weak. Further, as shown in FIGS. 9 and 10, even when gold or silver is allowed to contain the additive element, the peel strength increases to only about twice at most. Therefore, it is more preferable that cyclohexane molecules are added to the resin 2. The reason for this is as follows:

The distance between the second nearest-neighbor carbon atoms of the cyclohexane molecule is about 0.27 nanometers, and is larger than that of the benzene ring, so that mismatch from the respective nearest-neighbor interatomic distances of gold and silver of 0.288 and 0.289 nanometers is small.

Also for platinum, palladium and ruthenium, the nearest-neighbor interatomic distances are 0.277, 0.275, and 0.271 nanometers, respectively. Therefore, it is more desirable that the cyclohexane molecules with the distance between the second nearest-neighbor carbon atoms of about 0.27 nanometers are added. In the cases of copper and nickel, the nearest-neighbor interatomic distances are 0.255 and 0.249 nanometers, respectively. Therefore, it is not necessary to add the cyclohexane molecules thereto.

However, in the cases of copper and nickel oxidized so thinly as to allow a passage of electric current therethrough, the nearest-neighbor interatomic distance comes closer to about 0.3 nanometers by penetration of oxygen. Therefore, as with the cases of gold and silver, it is more desirable that cyclohexane molecules are added to the resin 2.

Figure 11:
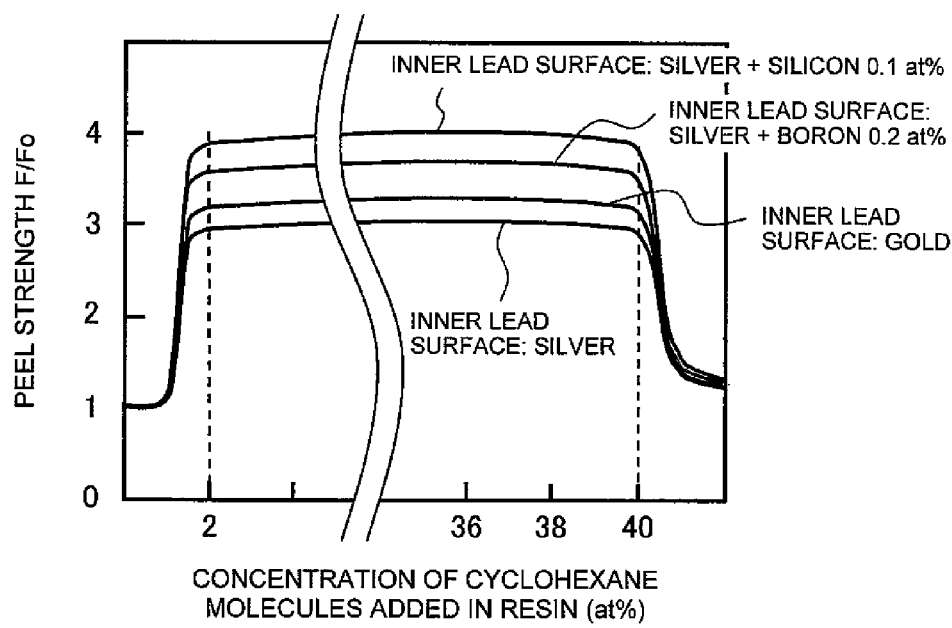
FIG. 11 is a graph showing effects of cyclohexane molecules added in the resin exerted on peel strength of the resin and gold or silver.
Figure 12:
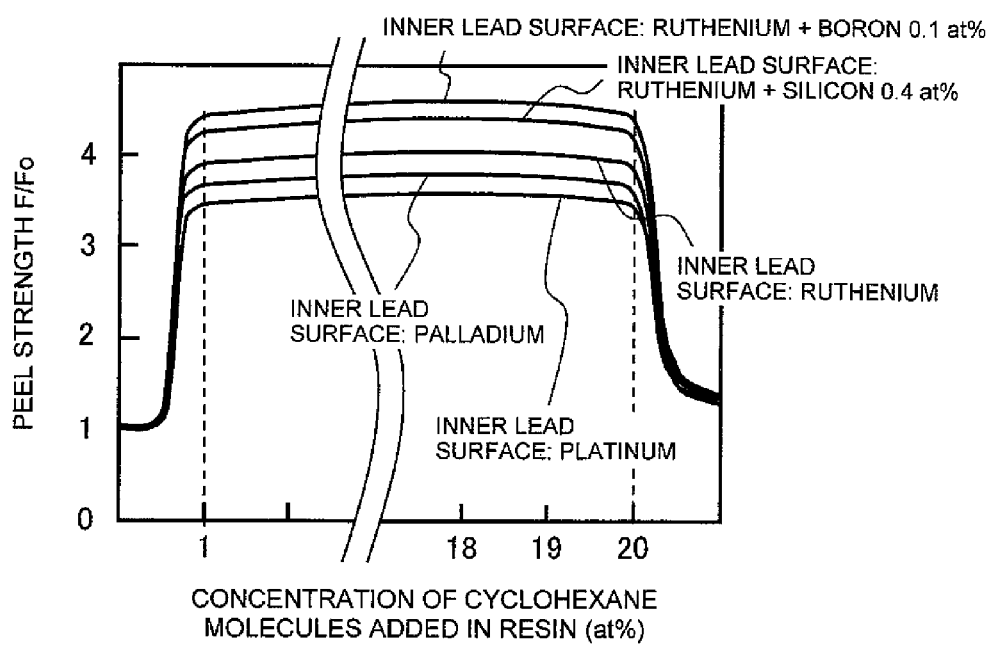
FIG. 12 is a graph showing effects of cyclohexane molecules added in the resin exerted on peel strength of the resin and platinum, palladium or ruthenium.
Figure 13:
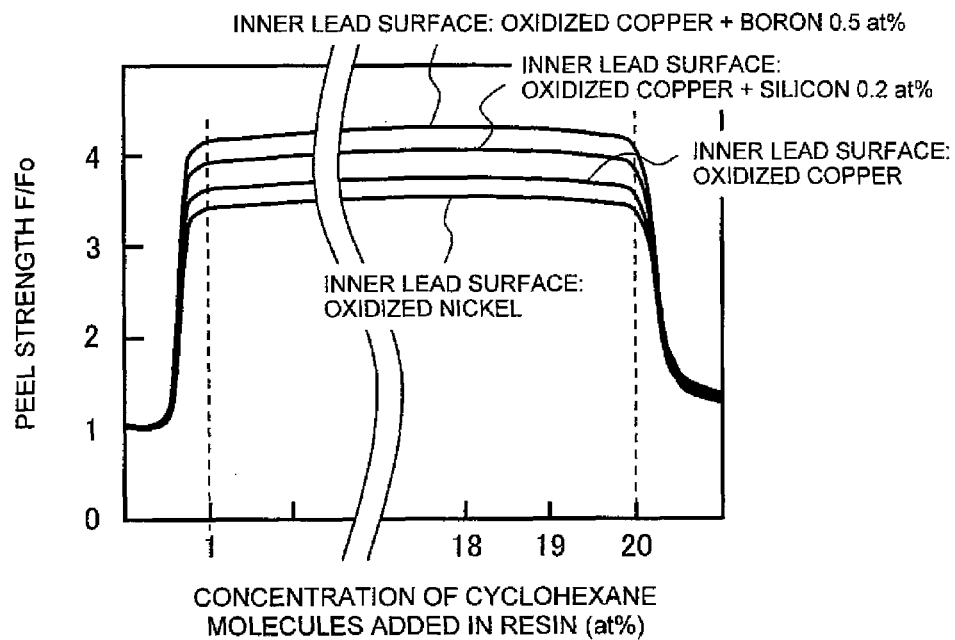
FIG. 13 is a graph showing effects of cyclohexane molecules added in the resin exerted on peel strength of the resin and oxidized copper or oxidized nickel.
Figure 14:
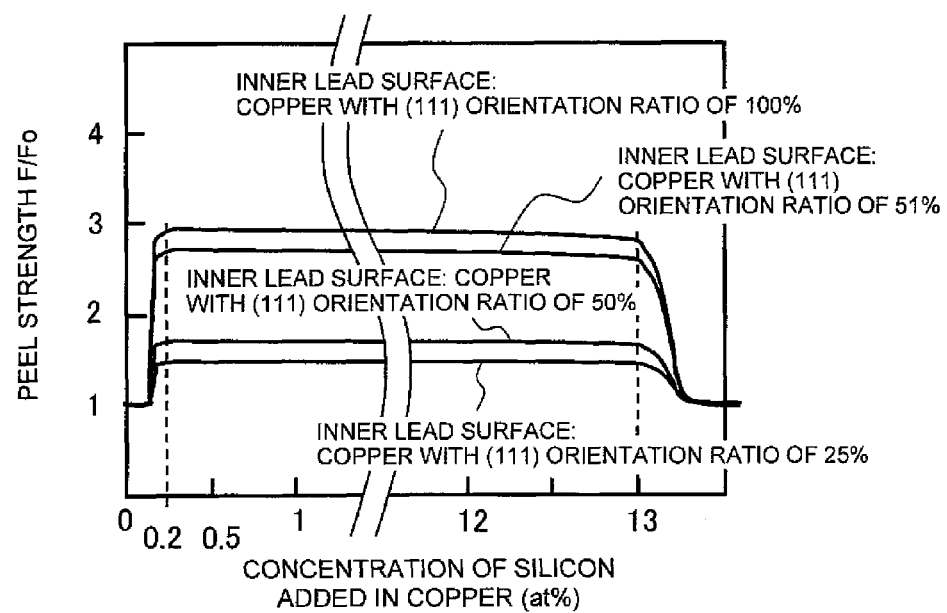
FIG. 14 is a graph showing effects of a (111) orientation ratio of copper exerted on the peel strength.
Figure 15:
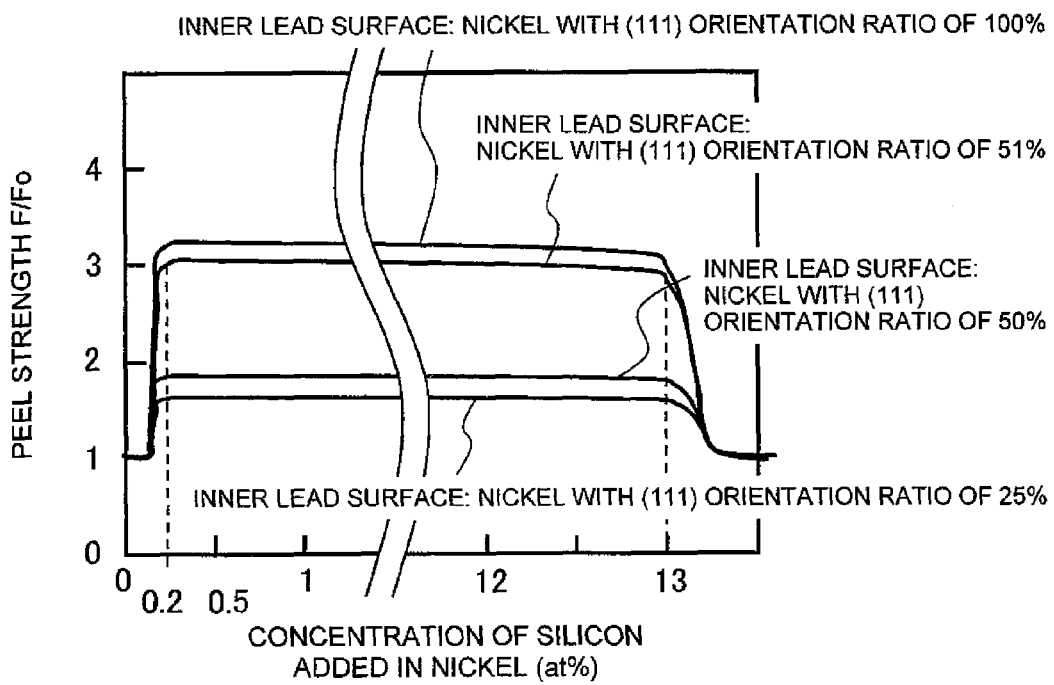
FIG. 15 is a graph showing effects of a (111) orientation ratio of nickel exerted on the peel strength.
Figure 16:
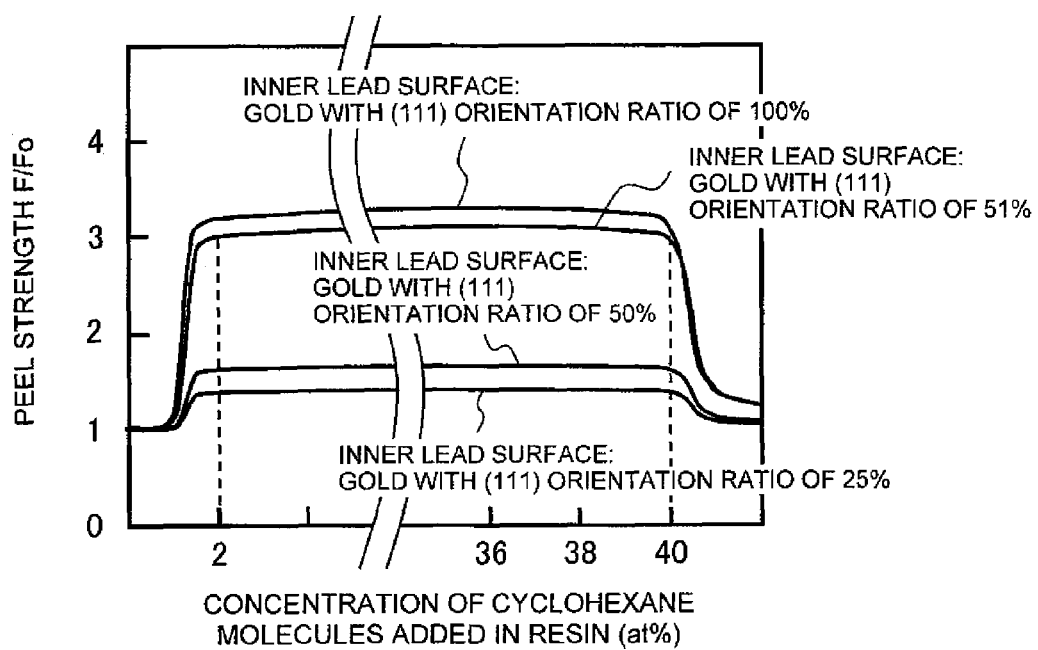
FIG. 16 is a graph showing effects of a (111) orientation ratio of gold exerted on the peel strength.
Figure 17:
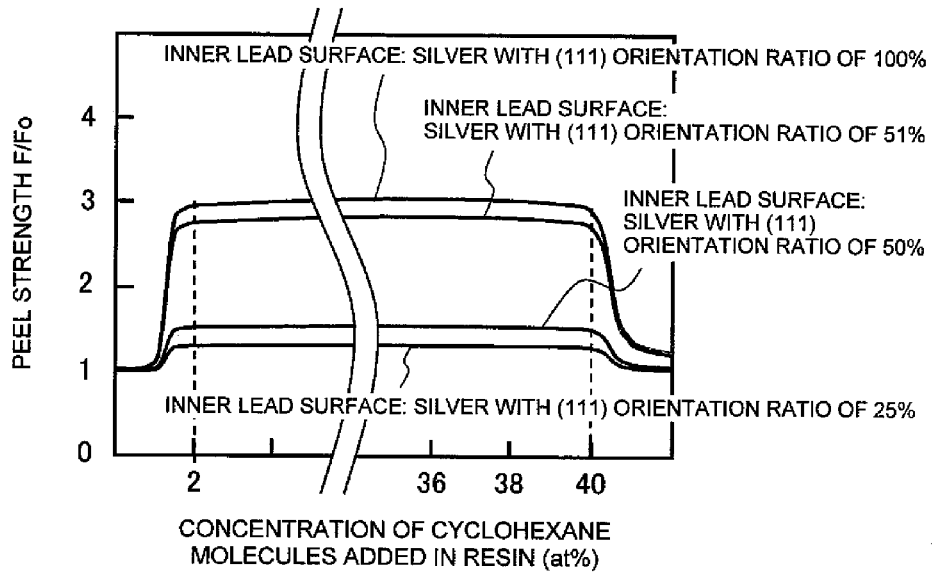
FIG. 17 is a graph showing effects of a (111) orientation ratio of silver exerted on the peel strength.
Figure 18:
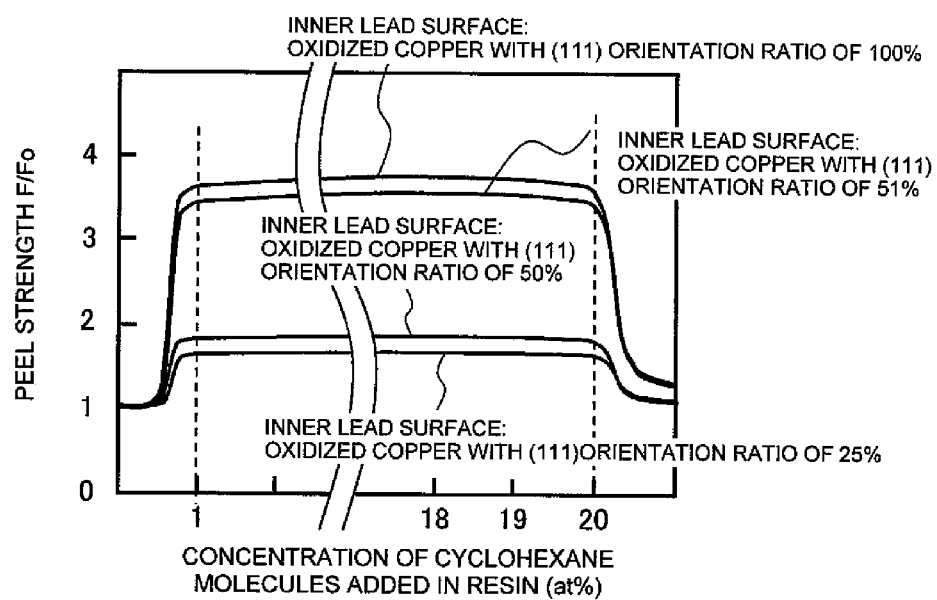
FIG. 18 is a graph showing effects of a (111) orientation ratio of oxidized copper and oxidized nickel exerted on the peel strength.

The graphs showing these effects are FIGS. 11 to 13. Also in these graphs, the peel strength F/Fo of the vertical axis is expressed in a nondimensionalized form by dividing the adhesive fracture energy F with the adhesive fracture energy Fo in the case of zero on the horizontal axis.

FIG. 11 is a graph showing the effects resulting from inclusion of cyclohexane in the resin 2 under a condition that the (111) oriented film of gold or silver is used as the surface material of the inner lead portion, and the liquid crystalline wholly aromatic polyester containing 80 at % benzene ring (e.g., SUMIKA SUPER manufactured by Sumitomo Chemical Co., Ltd.) is used as the resin 2.

FIG. 12 is a graph showing the effect resulting from inclusion of the cyclohexane in the resin 2 under a condition that the (111) oriented film of platinum or palladium, or the (001) oriented film of ruthenium is used as the surface material of the inner lead portion, and the liquid crystalline wholly aromatic polyester containing 80 at % benzene ring (e.g., SUMIKA SUPER manufactured by Sumitomo Chemical Co., Ltd.) is used as the resin 2.

FIG. 13 is a graph showing the effects resulting from inclusion of the cyclohexane in the resin 2 under a condition that the (111) oriented film of copper or nickel is used as the surface material of the inner lead portion, and the liquid crystalline wholly aromatic polyester containing 80 at % benzene ring (e.g., SUMIKA SUPER manufactured by Sumitomo Chemical Co., Ltd.) is used as the resin 2.

In these graphs, addition of the cyclohexane molecules is carried out by, for example, adding a coupling agent of 2-(3,4 epoxycyclohexyl) ethyltrimethoxysilane produced by Dow Corning Toray Co., Ltd. Alternatively, β-(3,4 epoxycyclohexyl) ethyltrimethoxysilane or the like can also be used.

As shown in FIGS. 11 to 13, concentration of the cyclohexane molecules to be added has a proper range for obtaining an effect, and too high concentration is not preferable. This is due to the following:

Too high concentration makes unstable linkages between benzene rings preset in the resin 2, so that the peel strength is rather reduced. From FIGS. 11 to 13, a proper concentration of cyclohexane molecules to be added is 2 to 40 at % in a total resin when the surface of the inner lead is gold or silver with (111) texture (this is referred to as (111) crystalline texture or (111) orientation.), the proper concentration of the cyclohexane molecules to be added is 1 to 20 at % when the surface of the inner lead is platinum or palladium with (111) texture, or ruthenium with (001) texture, and the proper concentration of the cyclohexane molecules to be added is 1 to 20 at % when the surface of the inner lead is formed of a material obtained by oxidizing copper or nickel with (111) texture.

Although only some examples are shown in FIG. 11, it is more preferable that gold or silver is allowed to contain one selected from a group consisting of 0.2 to 13 at % boron, 0.4 to 13 at % manganese, and 0.1 to 12 at % silicon as the additive element even when the cyclohexane molecules are added. Further, although only some examples are also shown in FIG. 12, it is more preferable that platinum, palladium or ruthenium is allowed to contain one selected from a group consisting of 0.1 to 12 at % boron, 0.2 to 13 at % manganese, and 0.4 to 13 at % silicon as the additive element even when the cyclohexane molecules are added. Still further, although only some examples are also shown in FIG. 13, it is more preferable that oxidized copper or oxidized nickel is allowed to contain one selected from a group consisting of 0.5 to 12 at % boron, 0.2 to 13 at % manganese, and 0.2 to 13 at % silicon as the additive element even when the cyclohexane molecules are added.

In the description up to this point, the case where the cyclohexane molecules (cyclohexane rings) were added was described. However, a feature of the present invention resides in that the distance between the second nearest-neighbor carbon atoms of the cyclohexane ring is close to the nearest-neighbor interatomic distance of the metal forming the surface material of the inner lead portion being in contact with the resin. Therefore, any compound is applicable so long as it is a compound having the cyclohexane ring.

The examples shown up to this point are examples for copper, nickel, platinum, palladium, gold, silver, oxidized copper, and oxidized nickel with a (111) orientation ratio of 100%, and an example for ruthenium with a (001) orientation ratio of 100%.

Figure 19:
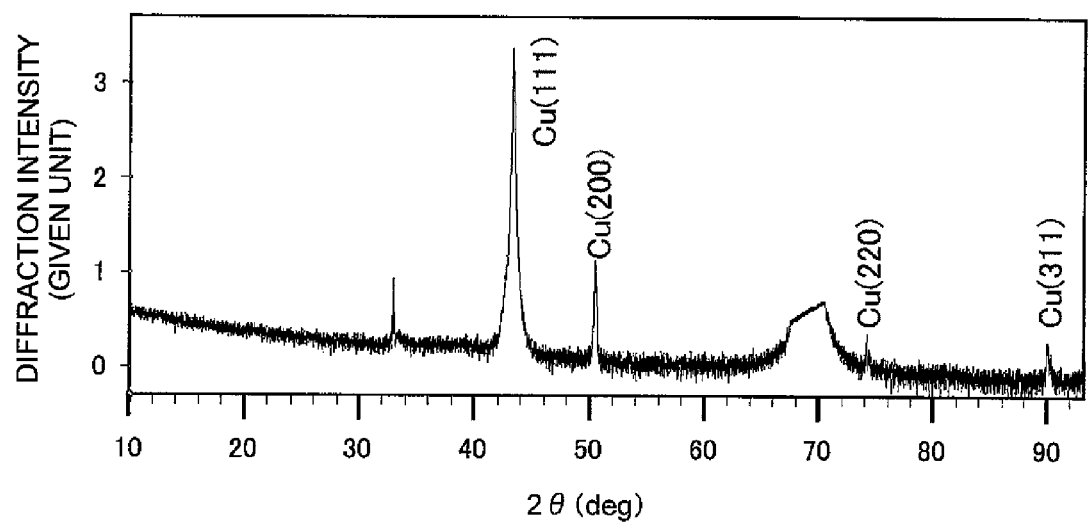
FIG. 19 is a graph showing an example of measurements of copper with a wide-angle X-ray diffraction.

However, as shown in FIGS. 14 to 18, it is indicated that almost the same peel strength improving effect as that in the case of 100% can be obtained even when the orientation ratio is not 100% but 51% or more. Herein, the (111) orientation ratio of copper, nickel, platinum, palladium, gold, silver, oxidized copper or oxidized nickel is defined as the value determined in the following manner:

In a wide-angle X-ray diffraction spectrum as shown in FIG. 19, a peak intensity at (111) is divided by a total sum of peak intensities at (111), (200), (220) and (311), and the quotient is multiplied by 100. The unit is %.

Whereas, the (001) orientation ratio of ruthenium is defined as the value determined in the following manner:

The peak intensity at (002) is divided by the total sum of the peak intensities at (100), (002) and (101), and the quotient is multiplied by 100. This is also expressed in unit of %.

As shown in FIGS. 14 to 18, it is more preferable that these orientation ratios are 51% or more. Further, although only some examples are shown in FIGS. 14 to 18, it is more preferable that copper or nickel is allowed to contain one selected from a group consisting of 0.5 to 12 at % boron, 0.2 to 13 at % manganese, and 0.2 to 13 at % silicon of as the additive element even when the orientation ratio is not 100%. Whereas, although not shown in FIGS. 14 to 18, it is more preferable that platinum, palladium or ruthenium is allowed to contain one selected from a group consisting of 0.1 to 12 at % boron, 0.2 to 13 at % manganese, and 0.4 to 13 at % silicon as an additive element, and it is more preferable that the cyclohexane molecules are added in a concentration of 1 to 20 at % to the resin 2 even when the orientation ratio is not 100.

Further, although not shown in FIGS. 14 to 18, it is more preferable that gold or silver is allowed to contain one selected from a group consisting of 0.2 to 13 at % boron, 0.4 to 13 at % manganese, and 0.1 to 12 at % silicon as an additive element, and it is more preferable that cyclohexane molecules are added in a concentration of 2 to 40 at % to the resin 2 even when the orientation ratio is not 100%. Still further, although not shown in FIGS. 14 to 18, it is more preferable that oxidized copper or oxidized nickel is allowed to contain one selected from a group consisting of 0.5 to 12 at % boron, 0.2 to 13 at % manganese, and 0.2 to 13 at % silicon as an additive element, and it is more preferable that cyclohexane molecules are added in a concentration of 1 to 20 at % to the resin 2 even when the orientation ratio is not 100%.

Up to this point, a description was given to the examples in which the liquid crystalline wholly aromatic polyester containing 80 at % benzene ring (e.g., SUMIKA SUPER manufactured by Sumitomo Chemical Co., Ltd.) was used as the resin 2, and the example in which the cyclohexane molecules were added thereto. However, when 40 at % or more benzene ring is contained as the resin 2, the same effect can be obtained. A concentration of the benzene ring of smaller than 40 at % reduces the effect of lattice matching characterized by the distance between the second nearest-neighbor carbon atoms of the benzene ring. Accordingly, the effect shown in this embodiment is reduced.

Figure 20:
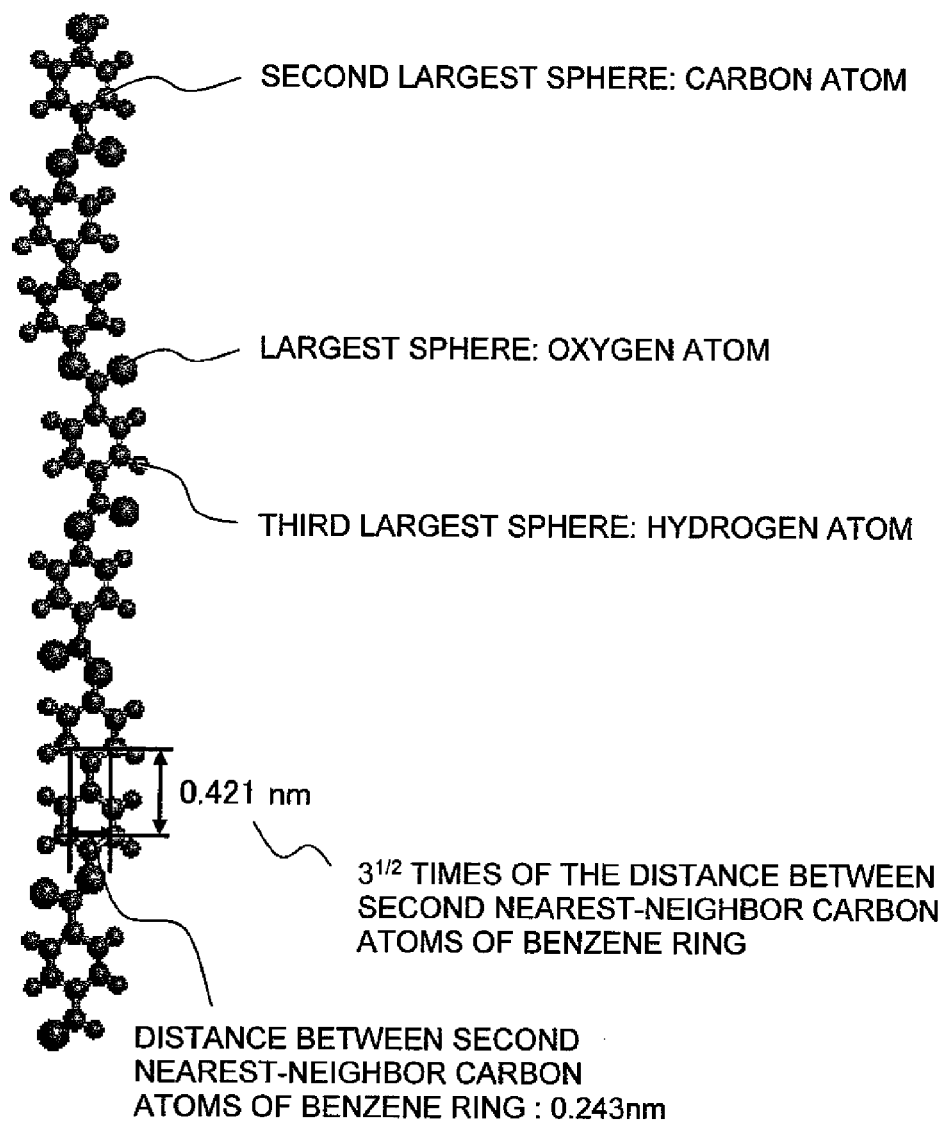
FIG. 20 is a view showing a molecular structure of a liquid crystalline wholly aromatic polyester containing 80 at % benzene ring (e.g., SUMIKA SUPER manufactured by Sumitomo Chemical Co., Ltd.).
Figure 21:
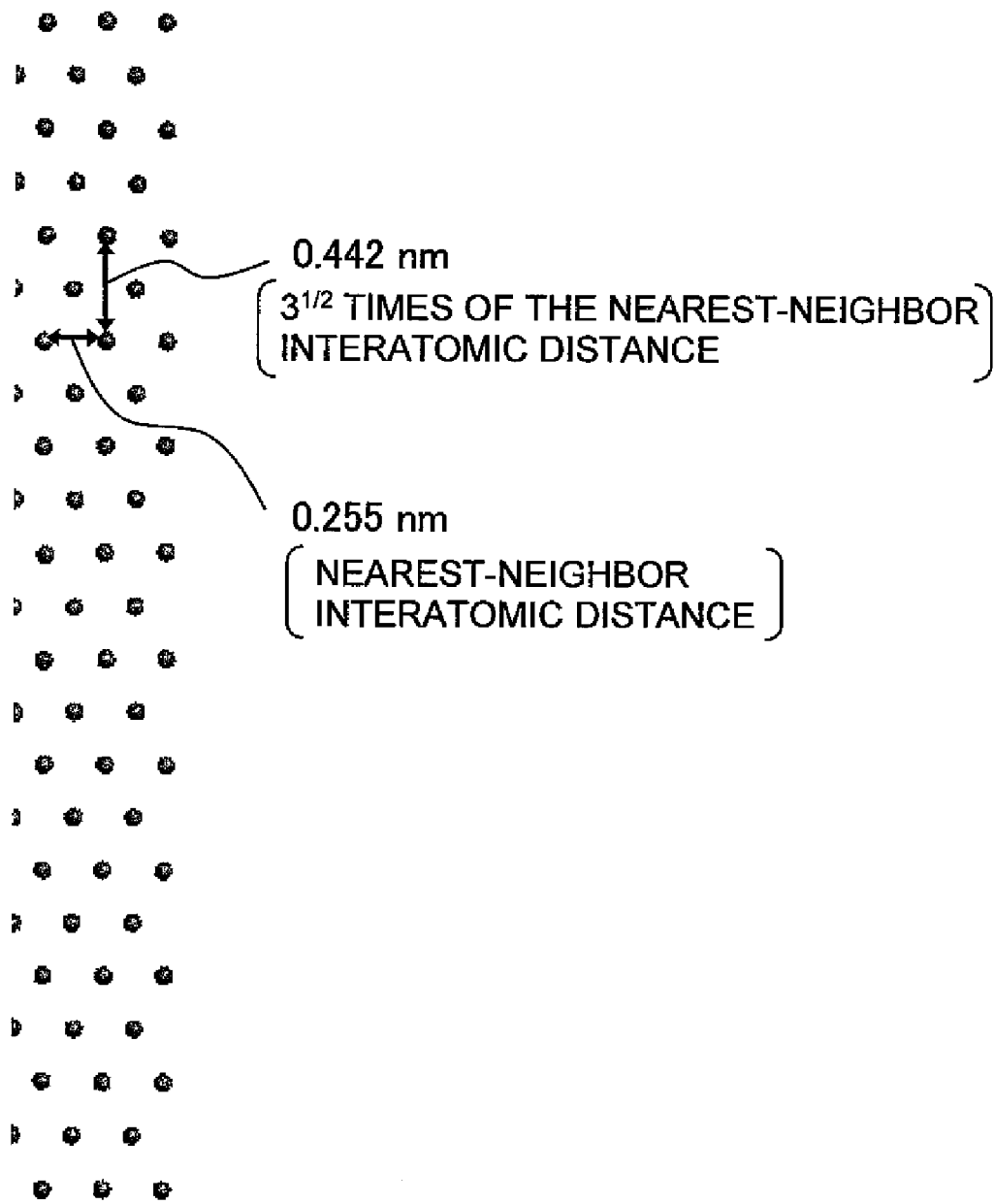
FIG. 21 is a view showing a crystal structure of a (111) surface of copper.
Figure 22:
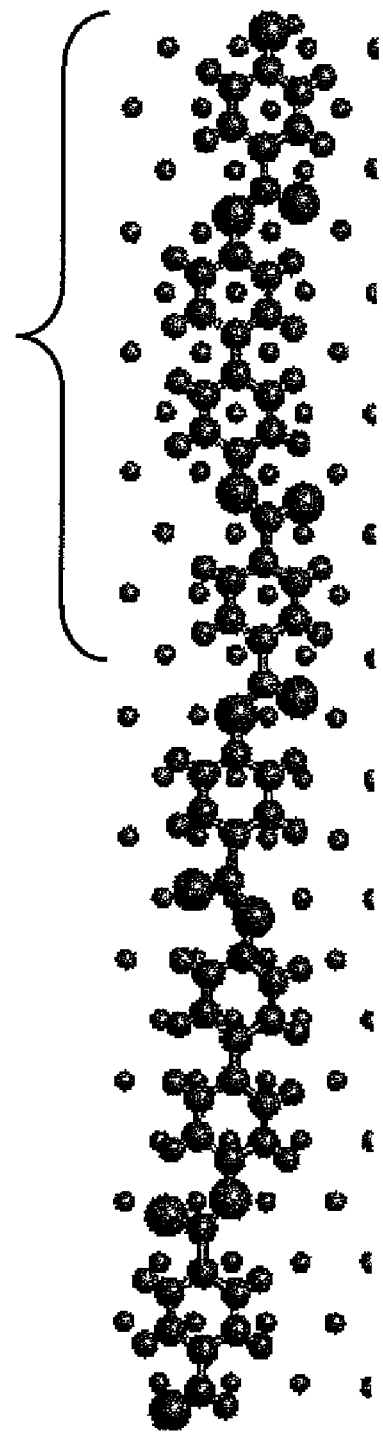
FIG. 22 is a top plan view of the molecular structure of the liquid crystalline wholly aromatic polyester superposed on the (111) surface of copper.

Then, an effect of lattice mismatch will be described in details. FIG. 20 shows a molecular structure of the liquid crystalline wholly aromatic polyester containing 80 at % benzene ring (e.g., SUMIKA SUPER manufactured by Sumitomo Chemical Co., Ltd.), wherein there are shown the distance between the second nearest-neighbor carbon atoms of the benzene ring of 0.243 nanometers and 0.421 nanometers which is square root of 3 times ($3^{1/2}$ times, about 1.73 times) thereof. FIG. 21 shows the (111) surface of copper, wherein there are shown the nearest-neighbor copper interatomic distance of 0.255 nanometers, and 0.442 nanometers which is square root of 3 times thereof. The nearest-neighbor copper interatomic distance of 0.255 nanometers is a value close to the distance between the second nearest-neighbor carbon atoms of the benzene ring of 0.243 nanometers, resulting in small lattice mismatch. FIG. 22 is a top plan view of the molecular structure of the liquid crystalline wholly aromatic polyester of FIG. 20 superposed on the (111) surface of copper of FIG. 21. FIG. 22 shows that a copper atom is arranged just under a center of a benzene ring, indicating that the lattice matching is favorable. Namely, at the interface at which the resin of this embodiment and copper atoms are in contact with each other, the benzene rings contained in the resin and the copper atoms are arranged so as to be superposed one on the other. This can improve the adhesion between the resin and the copper atoms.

Figure 23:
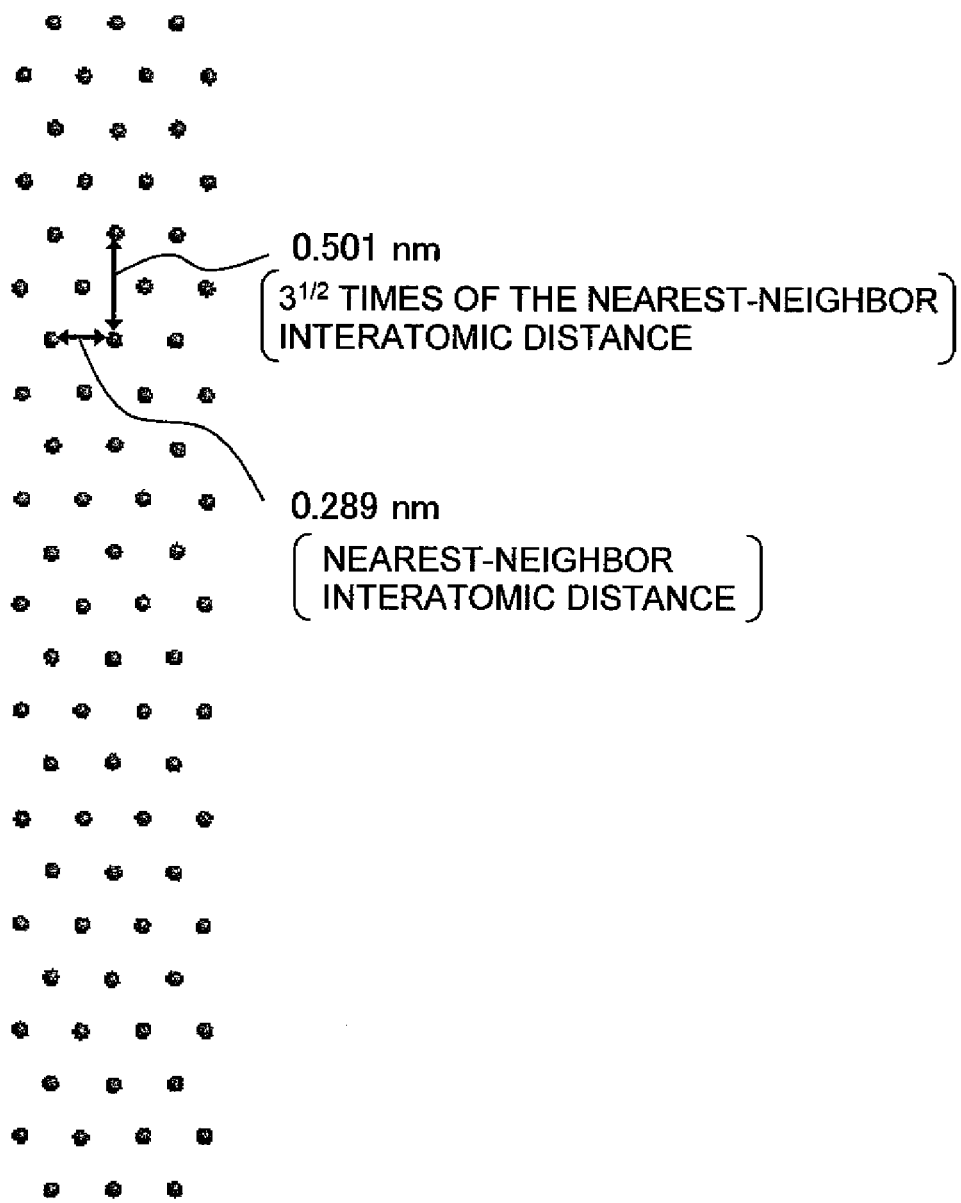
FIG. 23 is a view showing the crystal structure of the (111) surface of silver.
Figure 24:
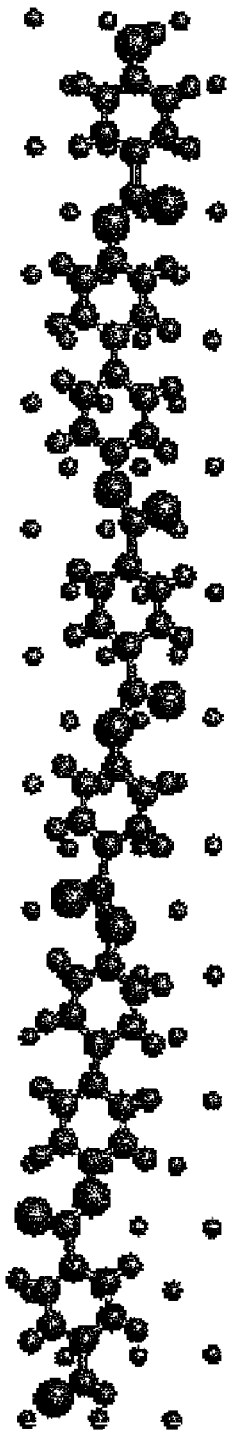
FIG. 24 is a top plan view of the molecular structure of the liquid crystalline wholly aromatic polyester superposed on the (111) surface of silver.

On the other hand, FIG. 23 shows the (111) surface of silver, wherein there are shown the nearest-neighbor silver interatomic distance of 0.289 nanometers, and 0.501 nanometers which is square root of 3 times thereof. The nearest-neighbor silver interatomic distance of 0.289 nanometers is a value very different from the distance between the second nearest-neighbor carbon atoms of the benzene ring of 0.243 nanometers, resulting in large lattice mismatch. FIG. 24 is a top plan view of a molecular structure of the liquid crystalline wholly aromatic polyester of FIG. 20 superposed on the (111) surface of silver of FIG. 23. FIG. 24 indicates that silver atoms are not arranged just under the centers of the benzene rings, resulting in unfavorable lattice matching.

On the other hand, the distance between the second nearest-neighbor carbon atoms of the cyclohexane molecules (cyclohexane rings) is about 0.27 nanometers, and is larger than that of the benzene ring. Accordingly, the mismatch from the nearest-neighbor interatomic distance of silver of about 0.289 nanometers is small. Thus, we found that, the smaller the mismatch is, the higher the peel strength is. We also found the effects of the additive element or additive molecules (cyclohexane molecules) based on this principle. Namely, by arranging the cyclohexane rings contained in the resin and silver atoms in a superposed manner at the interface at which the resin of this embodiment and silver atoms are in contact with each other, it is possible to improve the adhesion between the resin and the silver atoms.

Generally, by arranging the benzene rings and/or the cyclohexane rings contained in the resin and metal atoms in the superposed manner at the interface at which the resin and the metal atoms are in contact with each other, it is possible to improve the adhesion between the resin and the metal atoms.

As the curing agents in the resin 2, there can be used amine type compounds, acid anhydride type compounds, amide type compounds, phenol type compounds, and the like with no particular restriction, which are commonly used as the curing agents of epoxy resins. Specifically, these are diaminodiphenylmethane, diethylenetriamine, triethylenetetramine, diaminodiphenylsulfone, isophoronediamine, tertiary amines such as benzyldimethylamine, dicyandiamide, tetraethylenepentamine, benzyldimethylamine, ketimine compounds, polyamide resin synthesized from linolenic acid dimer and ethylenediamine, phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, methylhexahydrophthalic anhydride, bisphenols, polycondensates of phenols (such as phenol, alkyl-substituted phenols, naphthol, alkyl-substituted naphthols, dihydroxybenzene, or dihydroxynaphthalene) and various aldehydes, polymeric products of phenols and various diene compounds, polycondensates of phenols and aromatic dimethylol, or condensates of bismethoxymethyl biphenyl and naphthols or phenols, bisphenols and modified products thereof, imidazole, boron trifluoride-amine complexes, guanidine derivatives, and the like. The amount of the curing agent to be used is preferably 0.2 to 1.5 equivalents, and particularly preferably 0.3 to 1.2 equivalents per equivalent of epoxy group in the composition. Further, the amount of the curing agent to be used is preferably 0.3 to 20 wt %, and particularly preferably 0.5 to 10 wt % based on the amount of the epoxy group-containing compound (the epoxy resin compound of the present invention, and if required, other epoxy resins) when a tertiary amine is used as the curing agent.

The resin 2 of this embodiment can be allowed to contain a curing accelerator therein, if required. Examples of the curing accelerator may include imidazoles such as 2-methylimidazole, 2-ethylimidazole, and 2-ethyl-4-methylimidazole, tertiary amines such as 2-(dimethylaminomethyl)phenol, and 1,8-diaza-bicyclo(5,4,0)undecene, phosphines such as triphenylphosphine, metal compounds such as tin octylate, and quaternary phosphonium salts. The curing accelerator is used in an amount of 0.01 to 15 parts by weight per 100 parts by weight of the epoxy group-containing compound in a composition, if required.

A plating film on outer leads 3a containing tin (Sn) as a main constitutional material may be formed in prior arts. This is for the following reason, and a plating film is also preferably present in this embodiment.

The semiconductor device 1 shown in FIG. 1 is mounted on a mounting substrate. At this step, terminals formed on the mounting substrate and the leads 3 formed in the semiconductor device 1 are electrically connected. Solder is used for the electrical connection between the terminals and the leads 3. Therefore, although each lead 3 containing copper as the main constitutional material can be directly connected with the terminal through the solder the surface layer 10 (plating film) is formed on a surface of the lead 3 in order to improve wettability of the lead 3 with respect to the solder.

Thus, the surface layer 10 is formed on the surface of the lead 3, which improves the wettability between the lead 3 and the solder. This can improve connection reliability between the lead 3 and the terminal on the mounting substrate through the solder. A film for the surface layer 10 containing tin as a main material is used, tin having a favorable wettability with the solder. Further, it is possible to implement corrosion prevention and oxidation prevention of the lead 3 by forming the surface layer 10 on the surface of the lead 3.

Then, a description will be given to a method for manufacturing a semiconductor device in this embodiment. As a package form of this embodiment, the QFP was described. However, a description will be given to an SOP (Small Outline Package) which is the same package form of a surface mounting type as that of QFP in the method for manufacturing shown below. Whether the package form is the QFP or SOP, basic manufacturing steps are the same.

Figure 25:
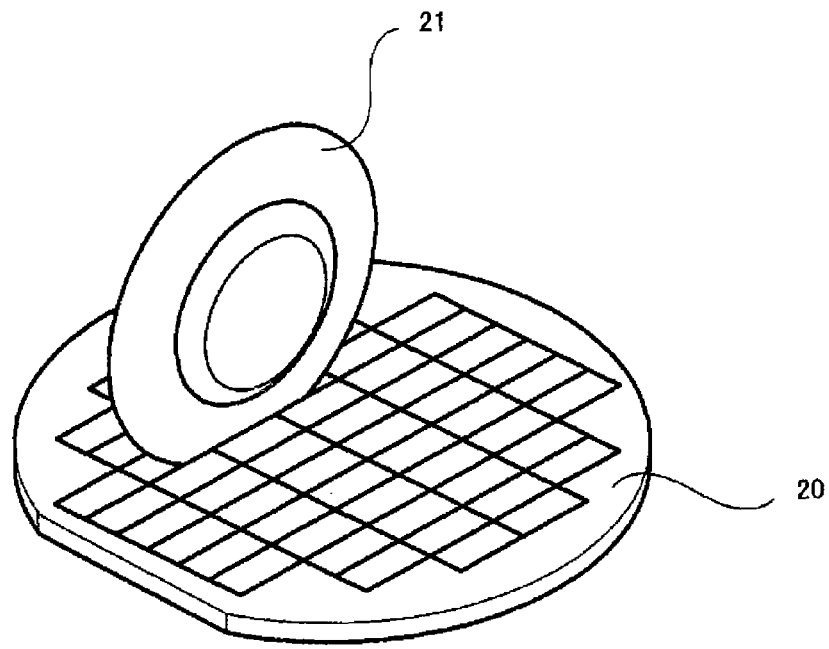
FIG. 25 is a perspective view showing a manufacturing step of the semiconductor device in an embodiment of the present invention, illustrating a step of dicing.

First, a semiconductor wafer 20 is prepared, as shown in FIG. 25. The semiconductor wafer 20 is divided into a plurality of chip regions. A LSI (Large Scale Integration Circuit) is formed in each of the plurality of chip regions. The LSIs are formed in a so-called wafer process (pre-step).

Subsequently, the semiconductor wafer 20 is cut by means of a blade 21. Namely, the semiconductor wafer 20 is cut in units of the chip regions, thereby to acquire semiconductor chips. On the other hand, a lead frame for mounting the semiconductor chip thereon is prepared. For example, the lead frame 22 contains copper as a main material.

Subsequently, a plating film is formed on the surface of the lead formed on the lead frame. In this plating step, the technical idea in this embodiment is embodied. For example, as described above, first, a gold film is formed on the surface of the lead with an electroplating process. Then, the plating film containing tin as the main material is formed on the gold film with an electroplating process.

Figure 26:
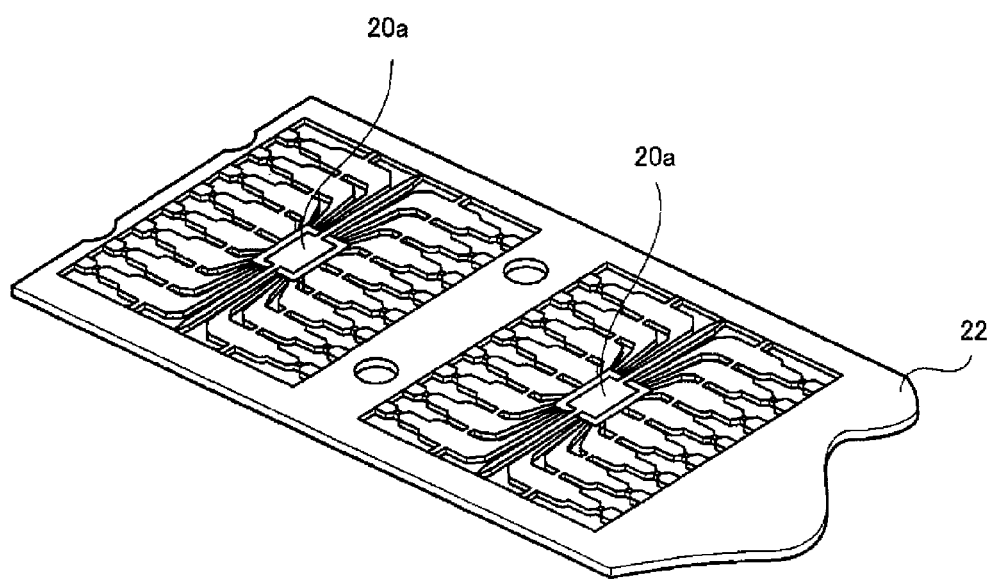
FIG. 26 is a perspective view showing a manufacturing step of the semiconductor device following FIG. 25, illustrating a step of mounting a semiconductor chip on a lead frame.

Then, as shown in FIG. 26, a semiconductor chip 20a is mounted on a tab of the lead frame 22 including a lead pattern subjected to a plating treatment formed thereon. The semiconductor chip 20a is mounted on the tab formed on the lead frame 22 by a die bonder.

Figure 27:
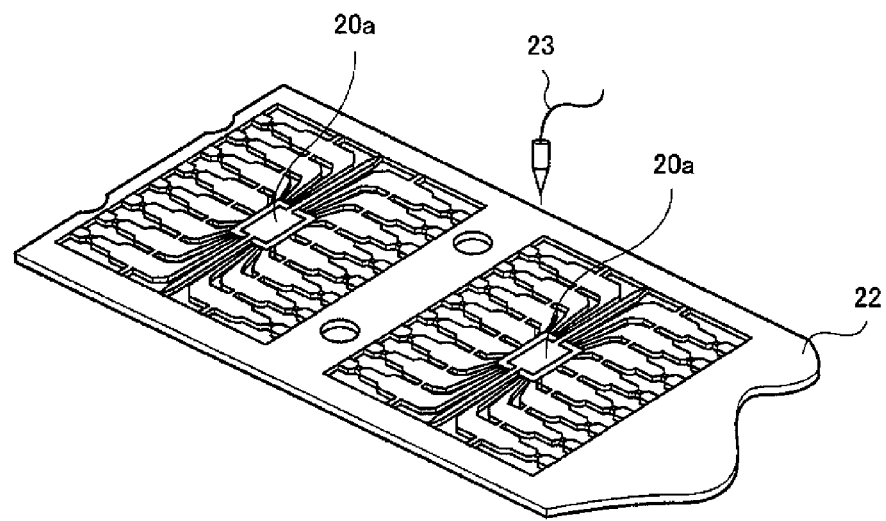
FIG. 27 is a perspective view showing a manufacturing step of the semiconductor device following FIG. 26, illustrating a step of electrically connecting the semiconductor chip and a lead through a wire.

Then, as shown in FIG. 27, a pad (not shown) formed on the semiconductor chip 20a mounted on the tab and a plurality of leads (inner leads) formed on the lead frame 22 are connected through wires 23. The wires 23 connect the pad and the leads by using capillaries.

Figure 28:
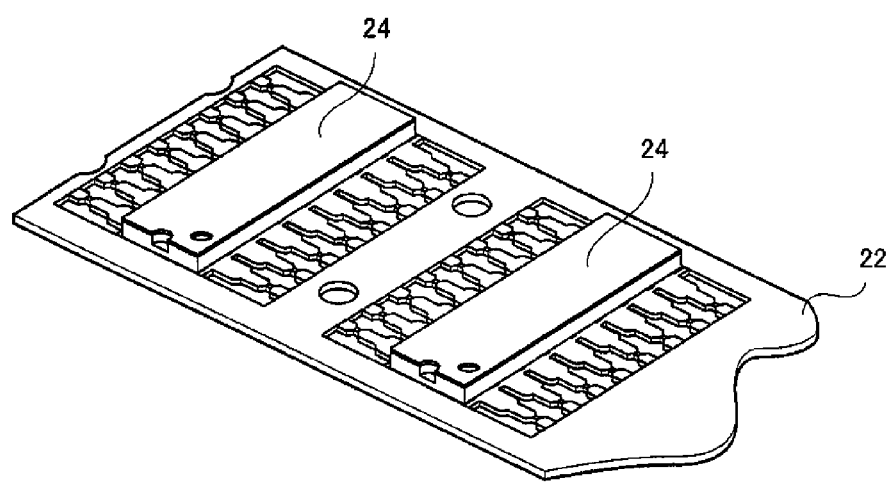
FIG. 28 is a perspective view showing a manufacturing step of the semiconductor device following FIG. 27, illustrating a step of sealing the semiconductor chip with a resin.

Then, as shown in FIG. 28, a region including the semiconductor chip 20a mounted on the lead frame 22 and the inner leads is sealed with a resin 24. Sealing with the resin 24 is performed for protecting the semiconductor chip 20a from impact by external force or permeation of moisture. The resin main body is desirably formed of thermosetting resins such as epoxy resins, polyimide resins, phenol resins, unsaturated polyester resins, and silicone resins, or heat resistant type thermoplastic resins such as liquid crystal polymers, polyphenylene oxide, polyphenylene sulfide (PPS) resin, polysulfone, and polyamide/imide/polyarylsulfone resins.

Figure 29:
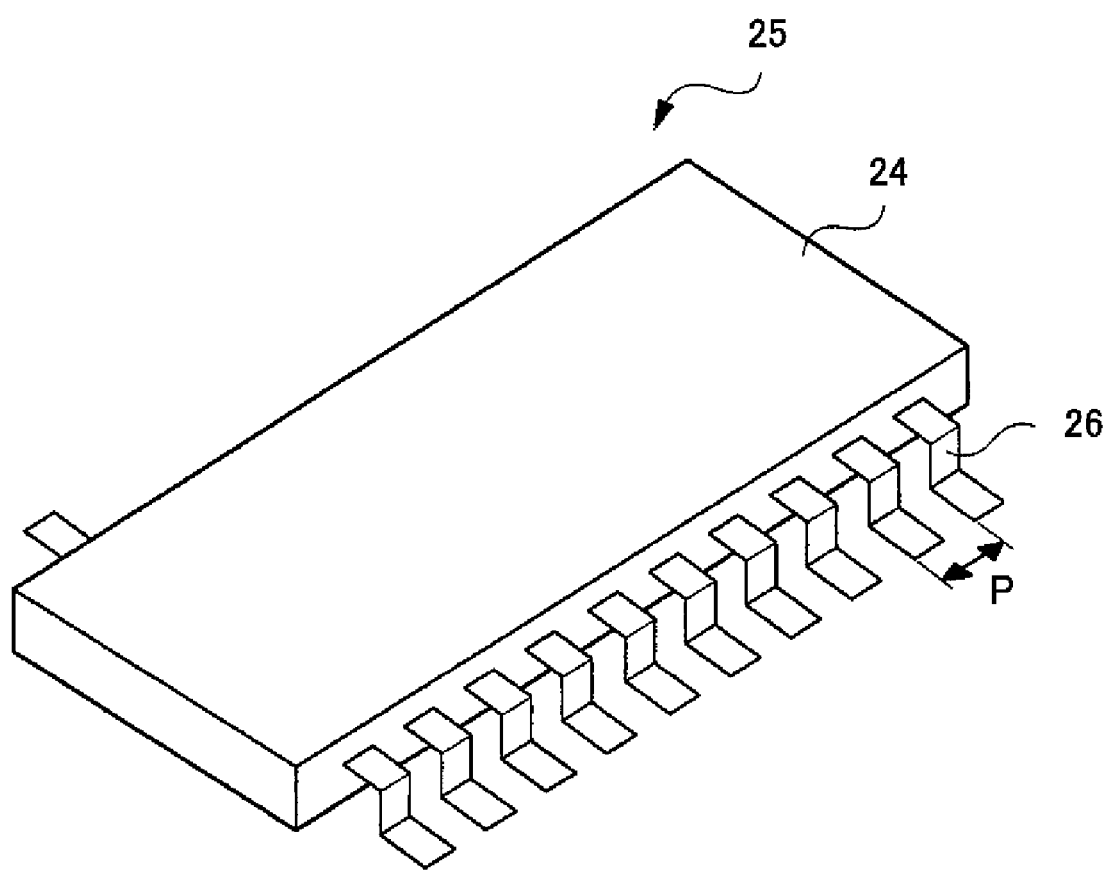
FIG. 29 is a perspective view of the semiconductor device showing an embodiment of the present invention.

Then, the sealing body sealed with the resin 24 is divided from the lead frame 22 into individual pieces. This can provide a semiconductor device 25 shown in FIG. 29. The semiconductor device 25 includes the sealing body sealed with the resin 24, and leads (outer leads) 26 projecting from the sealing body. Then, a plating film (not shown) is formed on the surface of each lead 26 projecting from the sealing body. In this figure, the leads 26 are arranged equidistantly with a pitch P.

Up to this point, the present invention made by us was described specifically by way of embodiments. However, the present invention is not limited to the embodiments. It is naturally understood that various changes may be made within a scope not departing from the gist thereof.

The present invention can be widely used for a manufacturing industry for manufacturing semiconductor devices.

What is claimed is:
1. A semiconductor device, comprising:
a semiconductor chip;
a plurality of leads including a metal as a main constitutional material, electrically connected with the semiconductor chip; and
a resin for sealing the semiconductor chip,
wherein the plurality of leads each have an outer lead portion exposed from the resin and an inner lead portion embedded in the resin, and the resin contains an aromatic compound having a benzene ring and/or a compound having a cyclohexane ring, and the benzene ring and/or the cyclohexane ring contained in the resin and a metal atom which is a main constitutional material of a surface material of the inner lead portion are arranged so as to be superposed one on the other at an interface at which the surface material of the inner lead portion and the resin are in contact with each other,
wherein the surface material of the inner lead portion contains one selected from a group consisting of boron, manganese and silicon as an additive element,
wherein the metal which is the main constitutional material of the surface material of the inner lead portion is copper or nickel,
wherein a content of the additive element is 0.5 to 12 at % under a condition that the additive element is boron, 0.2 to 13 at % under a condition that the additive element is manganese, and 0.2 to 13 at % under a condition that the additive element is silicon, and the resin is the aromatic compound containing the benzene ring,
wherein a surface crystal structure of the inner lead portion has a (111) crystalline texture of copper or nickel, and
wherein the surface material of the inner lead portion contains oxygen, and the resin is a resin prepared by adding 1 to 20 at % cyclohexane molecules to the aromatic compound containing 40 at % or more benzene ring.
2. A semiconductor device, comprising:
a semiconductor chip;
a plurality of leads including a metal as a main constitutional material, electrically connected with the semiconductor chip; and
a resin for sealing the semiconductor chip,
wherein the plurality of leads each have an outer lead portion exposed from the resin and an inner lead portion embedded in the resin, and the resin contains an aromatic compound having a benzene ring and/or a compound having a cyclohexane ring, and the benzene ring and/or the cyclohexane ring contained in the resin and a metal atom which is a main constitutional material of a surface material of the inner lead portion are arranged so as to be superposed one on the other at an interface at which the surface material of the inner lead portion and the resin are in contact with each other, wherein the resin is a resin prepared by adding 1 to 20 at % cyclohexane molecules to an aromatic compound containing 40 at % or more benzene ring.

3. The semiconductor device according to claim 2, wherein the surface material of the inner lead portion contains one selected from the group consisting of boron, manganese, and silicon as an additive element.

4. The semiconductor device according to claim 3, wherein the metal which is the main constitutional material of the surface material of the inner lead portion is copper, nickel, platinum, palladium, ruthenium, gold or silver.

5. The semiconductor device according to claim 3, wherein said metal is copper or nickel.

6. The semiconductor device according to claim 2, wherein the metal which is the main constitutional material of the surface material of the inner lead portion is copper, nickel, platinum, palladium, ruthenium, gold or silver.

7. The semiconductor device according to claim 6, wherein said metal is copper or nickel.

* * * * *